(12) United States Patent
Liu

(10) Patent No.: US 10,624,220 B2
(45) Date of Patent: Apr. 14, 2020

(54) DISPLAY DEVICE

(71) Applicant: AU OPTRONICS CORPORATION, Hsin-Chu (TW)

(72) Inventor: Hsiau-Hsuan Liu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/352,069

(22) Filed: Mar. 13, 2019

(65) Prior Publication Data

US 2019/0289727 A1    Sep. 19, 2019

(30) Foreign Application Priority Data

Mar. 13, 2018    (TW) .............................. 107108486 A

(51) Int. Cl.
| | | |
|---|---|---|
| *H05K 5/00* | (2006.01) | |
| *F16B 13/06* | (2006.01) | |
| *G06F 3/041* | (2006.01) | |
| *H05K 5/02* | (2006.01) | |

(52) U.S. Cl.
CPC ........... *H05K 5/0017* (2013.01); *F16B 13/06* (2013.01); *G06F 3/041* (2013.01); *H05K 5/0013* (2013.01); *H05K 5/0256* (2013.01)

(58) Field of Classification Search
CPC ..................................................... H05K 5/00
See application file for complete search history.

(56) References Cited

U.S. PATENT DOCUMENTS

2016/0295711 A1 * 10/2016 Ryu ...................... G09F 9/301

FOREIGN PATENT DOCUMENTS

| CN | 1987728 A | 6/2007 |
| CN | 102252019 B | 12/2012 |
| CN | 103064205 A | 4/2013 |
| CN | 206179429 U | 5/2017 |

OTHER PUBLICATIONS

The National Intellectual Property Administration (CNIPA), Office Action dated Nov. 28, 2019.

* cited by examiner

*Primary Examiner* — Jerry Wu
(74) *Attorney, Agent, or Firm* — WPAT, PC

(57) ABSTRACT

A display device including a frame, a pushing piece and a substrate is provided. The frame has a supporting platform and a through hole, and the supporting platform has a supporting surface, and the through hole penetrates through the supporting platform from the supporting surface. The pushing piece having a pushing surface is movably installed in the through hole. The pushing surface is close to the supporting surface while the pushing piece is in the through hole. The substrate is installed on the frame to cover the pushing surface and be connected to the supporting surface. When the pushing piece moves relatively to the through hole and protrudes from the supporting surface, the pushing surface pushes the substrate and separates the substrate from the supporting surface.

15 Claims, 6 Drawing Sheets

DISPLAY DEVICE

TECHNICAL FIELD

The present invention is related to a display device, specifically, the present invention is related to a display device which can easily rework.

BACKGROUND

Various display devices, such as Liquid Crystal Display (LCD), Organic Light Emitting Diode Display (OLED), touch display device and etc., have been widely used in human life. And the thickness and weight of the display devices have been constantly reduced as the technology advances. As the display devices continue to be thinner and lighter, the assembly of the display device becomes more difficult due to the increasing precision of the display device. Therefore, in the process of, for instance, testing or repairing, how to rework on the display device is also one of the significant topics.

In the existing display device, the frame is adhered with the display panel by a double-sided tape. In order to provide a more stable fixing effect, a double-sided tape with greater viscosity is chosen to adhere to the display panel during the production process of the display device. However, the fixation method increases the difficulty of reworking the display device as well. Since the display panel used in the display device is very thin and light, the display panel will be damaged if removing the display panel directly from the frame due to the adhesion of the double-sided tape; therefore, to destroy the frame to reduce the probability of damaging the display panel becomes inevitable. However, the aforementioned rework method will, no doubt, need to sacrifice the frame or even the display panel, thus, how to reduce the scrapping cost of these rework processes becomes a problem that needs to be solved.

SUMMARY

One of the purposes of the present invention is to provide a display device that can enhance the disassemble efficiency as well as cut down the component damages.

One of the purposes of the present invention is to provide a display device that can reduce the difficulty of reworking.

The display device of the present invention includes a frame, a pushing piece and a substrate. The frame has a supporting platform and a through hole, and the supporting platform has a supporting surface, and the through hole penetrates through the supporting platform from the supporting surface. The pushing piece having a pushing surface is movably installed in the through hole. The pushing surface is close to the supporting surface while the pushing piece is in the through hole. The substrate is installed on the frame to cover the pushing surface and be connected to the supporting surface. When the pushing piece moves relatively to the through hole and protrudes from the supporting surface, the pushing surface pushes the substrate and separates the substrate from the supporting surface.

Thus, the supporting surface of the frame can bear the substrate, and the pushing piece can also move relatively to the through hole in order to push the substrate, separating it from the frame more easily.

DESCRIPTION OF EMBODIMENTS

The present invention provides a display device which can easily separate the frame and the substrate with the pushing piece, reducing the difficulty of reworking the display device. The display device, for instance, includes LCD, OLED, electrophoretic display (EPD), and other self-luminescent or non-self-luminescent display device.

Figure 1:
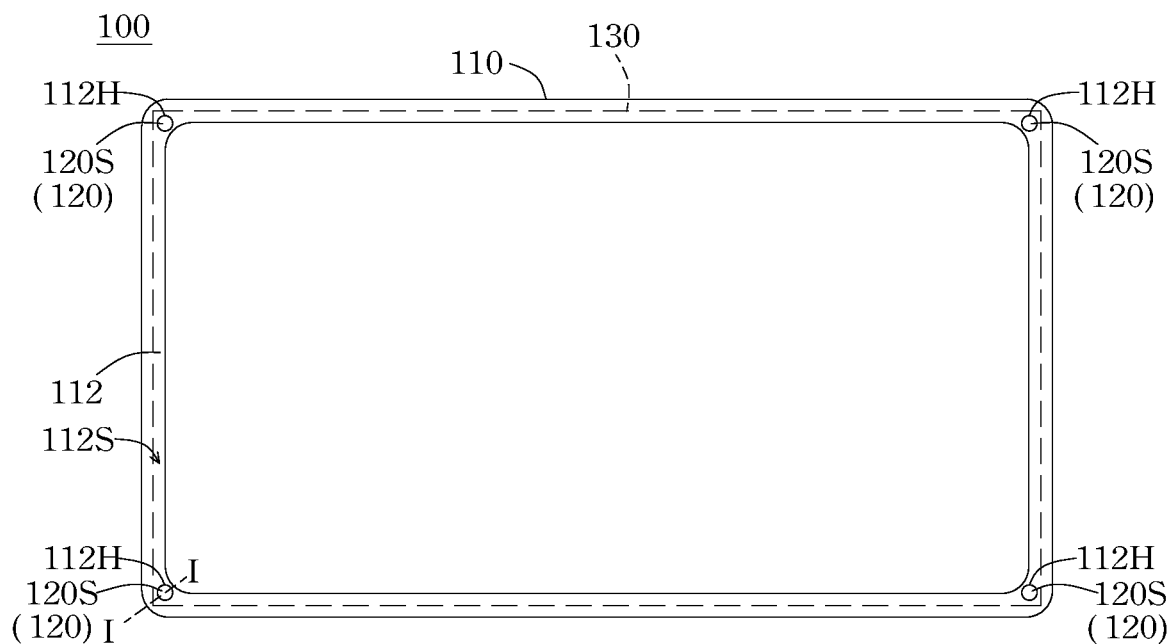
FIG. 1 is the schematic view of the first example of the display device.
Figure 2:
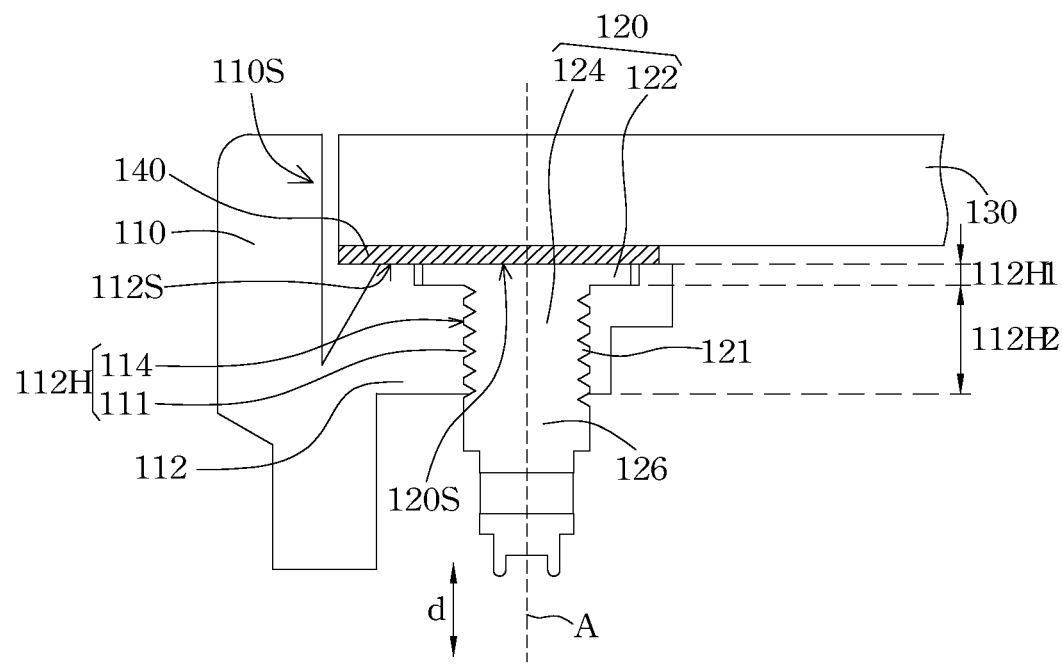
FIG. 2 is the partial sectional view of the first example of the display device according to the sectional line I in FIG. 1.

FIG. 1 is the top view of the display device in the first embodiment of the present invention. In order to explain explicitly the connecting relation of each component of the display device in the example, FIG. 1 here is drawn in the way of penetrating the substrate, so as to elaborate clearly the display device of the example with the following contents, this is not intended to limit the present invention. FIG. 2 is the partial sectional view along the sectional line I-I in FIG. 1, FIG. 3 is the partial sectional view of the display device along the sectional line I-I in another status, wherein, to illustrate plainly, only the section adjacent to the sectional line I-I is drawn, whereas other components are omitted, but this is not intended to limit the present invention.

Figure 3:
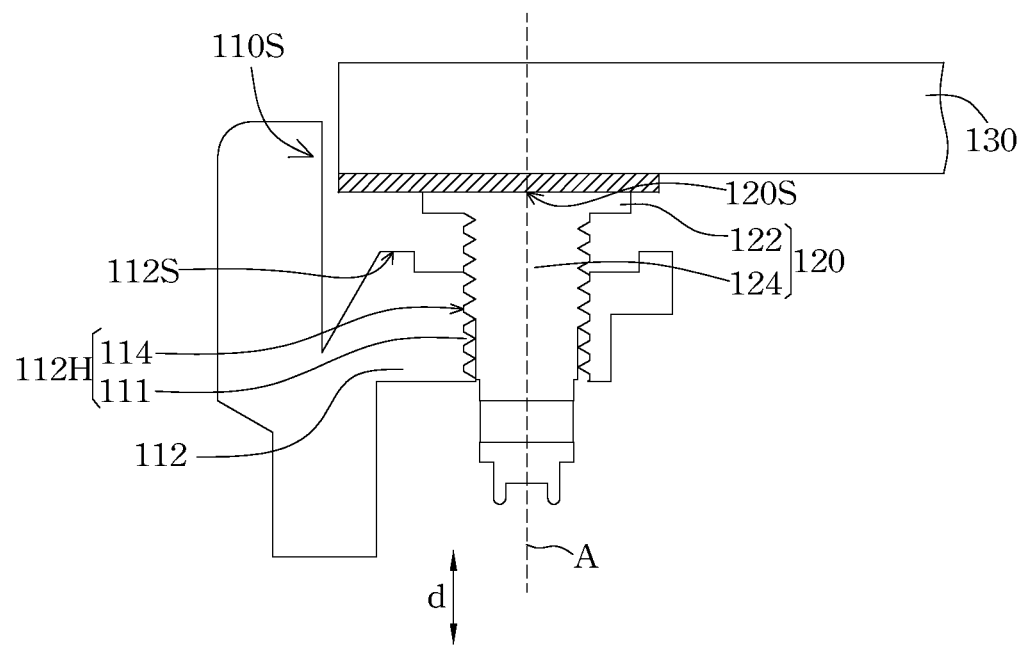
FIG. 3 is the sectional view of the first example of the display device in another status.

Please refer to FIG. 1 to FIG. 3, the display device 100 of the first embodiment of the present invention includes a frame 110, a pushing piece 120, and a substrate 130, wherein the frame 110 provides accommodating space to accommodate the substrate 130. In an embodiment, the substrate 130 is, for instance, a cover lens, a touch panel, or a display panel, but it is not limited thereto. The frame 110 has a supporting platform 112 and a through hole 112H, and the supporting platform 112 has a supporting surface 112S, and the through hole 112H penetrates through the supporting platform 112 from the supporting surface 112S. The pushing piece 120 is movably installed in the through hole 112H, and the supporting platform 112 reveals the pushing piece 120 on the supporting surface 112S. The pushing piece 120 having a pushing surface 120S is close to the supporting surface 112S while the pushing piece 120 is in the through hole 112H.

When the pushing piece 120 is located in the through hole 112H, meaning, for instance, the pushing piece 120 is installed in the frame 110, and the substrate 120 can be disposed on the frame 110 and the pushing piece 120. When the substrate 130 is installed on the frame 110, the substrate 130 covers the pushing piece 120 and is connected to the supporting surface 112S. For instance, the through hole 112H of the embodiment is located in the position of the supporting platform 112 connecting to the corner area of the substrate 130. In other examples, the through hole can even be installed on other positions of the supporting platform connecting to the substrate, the present invention is not limited to this.

Please refer to FIG. 2, in an embodiment, the frame 110, for instance, has a substantially upright frame wall 110S which faces the substrate 130, and the frame wall 110S, for instance, extends around the substrate 130. The supporting platform 112 protrudes from the frame wall 110S towards the inner space surrounded by the frame wall 110S to support the bottom edge of the substrate 130. In the embodiment, the through hole 112H penetrates the supporting platform 112 from the supporting surface 112S of the supporting platform 112, and forms an opening on the supporting surface 112S, whereas the pushing piece 120 can move up and down in the through hole 112H, allowing the pushing surface 120S to optionally moving away from the opening formed by the through hole 112H on the supporting surface 112S, such as extending out of the opening or retracting into the opening. The substrate 130 is disposed on the frame 110 connecting to the supporting surface 112S, and the substrate 130 is also located on the pushing piece 120 covering the pushing surface 120S.

Please refer to FIG. 3, to be more precise, FIG. 3 is the sectional view of the pushing piece 120 of the embodiment extending out of the opening after moving relatively to the through hole 112H. When the pushing piece 120 of the embodiment moves relatively to the through hole 112H and protrudes from the supporting surface 112S, the pushing surface 120S can extend out of the opening and push the substrate 130 away from the supporting surface 112S, separating the substrate 130 from the supporting surface 112S.

In other words, the pushing piece 120 in the through hole 112H of the supporting platform 112 on the frame 110 in the example can selectively move between an installation position and a protruding position. When the pushing piece 120 is disposed at the installation position in the through hole 112H, as shown in FIG. 2, the substrate 130 can be connected with the supporting platform 112 on the frame 110. In an embodiment, the substrate 130, for instance, can be connected with the supporting surface 112S of the supporting platform 112 by the adhesive layer 140. When the pushing piece 120 departs from the installation position in the through hole 112H to the protruding position, as shown in FIG. 3, the pushing piece 120 protrudes from the supporting surface 112S of the supporting platform 112, and thus the pushing surface 120S of the pushing piece 120 can push the substrate 130, separating it from the supporting surface 112S of the supporting platform 112.

Please refer to FIG. 2 and FIG. 3, in an embodiment, the substrate 130 can be connected with the frame 110 by the adhesive layer 140 such as double-sided tape, curing adhesive or other appropriate adhesive materials. In an embodiment, the adhesive layer 140, for instance, is disposed between the supporting surface 112S and the substrate 130, and the substrate 130 can be connected with the supporting surface 112S by the adhesive layer 140; in order to connect the substrate 130 and the frame 110 more closely, the adhesive layer 140 can also be disposed between the pushing surface 120S and the substrate 130, and the substrate 130 is connected with the pushing surface 120S by the adhesive layer 140. By pushing the substrate 130 with the pushing piece 120 and changing the accommodating space of the frame 110 for the substrate 130, the tools and process of removing the substrate 130 will not be restricted by the narrow space between the substrate 130 and the frame wall 110S of the frame 110, and the substrate 130 or the frame 110 will not even be damaged during the removing process. Therefore, the pushing piece 120 can appropriately separate the connection between the frame 100 and the substrate 130.

Please refer to FIG. 2 and FIG. 3, in an embodiment, the substrate 130 is connected to the supporting surface 112S of the supporting platform 112 and the pushing surface 120S of the pushing piece 120 by the adhesive layer 140.

Besides the supporting surface 112S of the supporting platform 112, the pushing surface 120S of the pushing piece 120 also offer other contact area for the adhesive layer to be disposed. Moreover, moving the pushing piece 120 can allow the pushing surface 120S to push the substrate 130 and the adhesive layer 140 above, separating the substrate 130 from the supporting platform 112. On the other hand, in an embodiment, the pushing surface 120S of the pushing piece 120 may have, for instance, a rough structure or a material different from the supporting surface 112S so as to adjust the adhesion between the pushing surface 120S and the adhesive layer 140, causing a stronger adhesion between the adhesive layer 140 and the supporting surface 112S than the adhesion between the adhesive layer 140 and the pushing surface 120S, thus, after separating the substrate 130 from the supporting platform 112 by moving the pushing piece 120, the pushing surface 120S can easily be removed from adhesive layer 140 without damaging the substrate 130. In an embodiment, the rough structure of the pushing surface 120S of the pushing piece 120 can be, for instance, the tool recess for tools to rotate for screwing the pushing piece 120.

Figure 4:
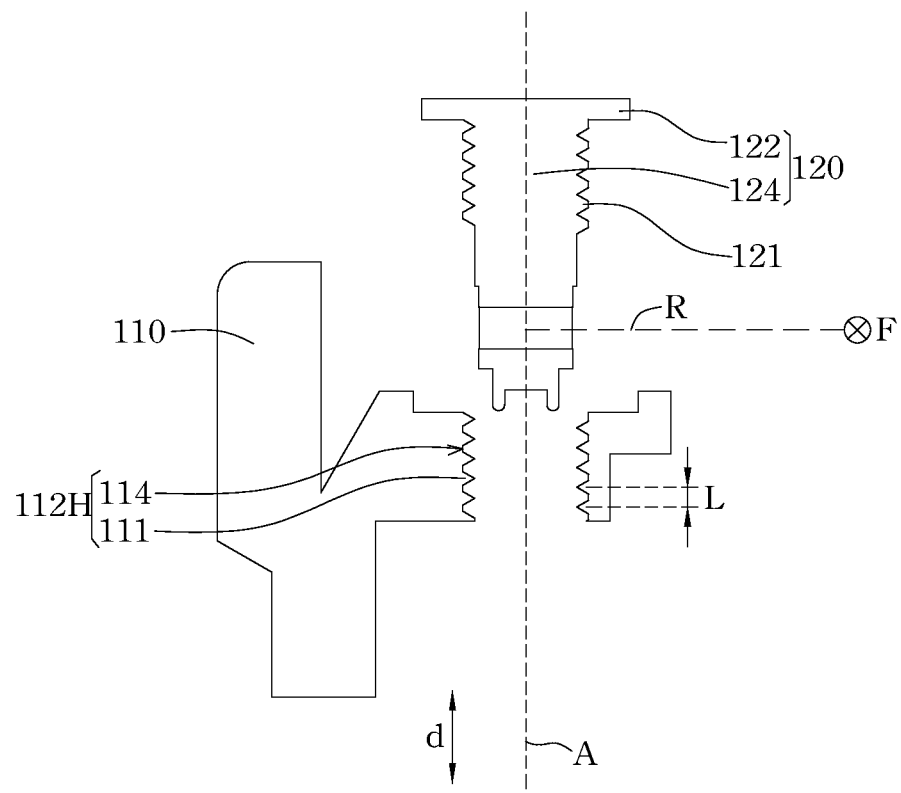
FIG. 4 is the exploded view of the frame and the pushing piece in the first example.

FIG. 4 is the partial schematic view of the pushing piece 120 is separating from the frame in the first embodiment of the present invention. Please refer to FIG. 4, the frame 110 corresponded to the through hole 112H has inner thread 111, in an embodiment, the through hole 112H can be surrounded by the inner wall 114 of the frame 110, the inner wall 114, for instance, is formed directly on the supporting platform 112 of the frame 110 and is with inner thread 111. The inner thread 111 can be formed directly on the inner wall 114 to corresponding to an outer thread 121 of the pushing piece 120. The pushing piece has the outer thread 121 which can mesh with the inner thread 111, and the relative rotation of the outer thread 121 and the inner thread 111 allows the pushing piece 120 to move relatively to the through hole 112H. For instance, when the pushing piece 120 rotates along the rotating axis A, the relative rotation of the outer thread 121 and inner thread 111 allows the pushing piece 120 to move along the direction d. Moreover, please refer to FIG. 3, in an embodiment, between the pushing surface 120S and the adhesive layer 140, there is, for instance, a weaker adhesion, so that the pushing surface 120S can rotate relatively easily to the adhesive layer 140, and the pushing piece 120 can rotate more easily to push the substrate 130. Also, by rotating the pushing piece 120 to allow the pushing surface 120S to push the substrate 130, the effect of labor-saving is also achieved. Furthermore, in an example, a hole can also be made at the position on the adhesive layer 140 corresponded to the pushing surface 120S so as to reveal the pushing surface 120S of the pushing piece 120 from the adhesive layer 140 (not shown in the figure), and, in that way, the pushing piece 120 can rotate much more easily to push the substrate 130.

The pushing piece 120 of the first embodiment of the present invention further includes a column 124 and a flange 122. Please refer to FIG. 5, the perspective view of the pushing piece in the first embodiment of the present invention. The outer thread 121 of the pushing piece 120 can be formed on the outer surface of the column 124. The flange 122 connecting to one side of the column 124 can radially protrude from the column 124, and the pushing surface 120S can be formed on a side of the flange 122 facing away from the column 124. The area of the pushing surface 120S of the pushing piece 120 is bigger than the cross-sectional area of the column 124 perpendicular to the rotating axis A, thus an appropriate force can be provide when the pushing piece 120 pushes the substrate 130, and the contact area of the adhesive layer 140 to the pushing piece 120 can be increased as well. Moreover, when rotating for screwing the pushing piece 120 to the frame 110, the flange 122 of the pushing piece 120 abuts against the frame 110 to ensure that the pushing piece 120 has been disposed on the frame 110 well.

Please refer to FIG. 2, in an embodiment, the shape of the through hole 112H corresponds to the shape of the pushing piece 120, for instance, the through hole 112H includes a shank part 112H1 and a threaded part 112H2, here in FIG. 2, both parts are marked along the extending direction of the through hole 112H. The shank part 112H1 is located between the supporting surface 112S and the threaded part 112H2, the aperture of the shank part 112H1 near the supporting surface 112S is bigger than the aperture of the threaded part 112H2 away from the supporting surface 112S, and the inner space of the shank part 112H1 and the threaded part 112H2 is substantially similar to the appearance of the pushing piece 120 with flange 122. Taking FIG. 2 as an example, both the inner space of the through hole 112H and the pushing piece 120 have an substantially, for instance, T-shaped section, thus the pushing piece 120 and the through hole 112H can be matched when the pushing piece 120 is disposed into the through hole 112H.

The shank part 112H1 is located between the supporting surface 112S and the threaded part 112H2, and the aperture of the through hole 112H in the shank part 112H1 is bigger than the aperture of the through hole 112H in the threaded part 112H2, and the frame 110 corresponding to the threaded part 112H2 of the through hole 112H has the inner thread 111. When the pushing piece 120 is disposed in the through hole 112H, the flange 122 is within the shank part 112H1 of the through hole 112H, and the inner wall 114 corresponding to the threaded part 112H2 can accommodate part of the pushing piece 120 with the outer thread 121.

Moreover, in an embodiment, the thickness of the flange 122 is the same as the length of the shank part 112H2 in the normal direction of the support surface 112S. And the pushing piece 120 can be disposed to make the pushing surface 120S and the supporting surface 112S coplanar and the adhesive layer 140 can connect the pushing surface 120S and the supporting surface 112S both. However, the invention is not limit thereto. When the area of the supporting surface 112S of the frame 110 is enough for the adhesive layer 140 adhered on to fix the substrate 130 on the frame 110, the thickness of the flange 122 can be less than the length of the shank part 112H1.

Figure 5:
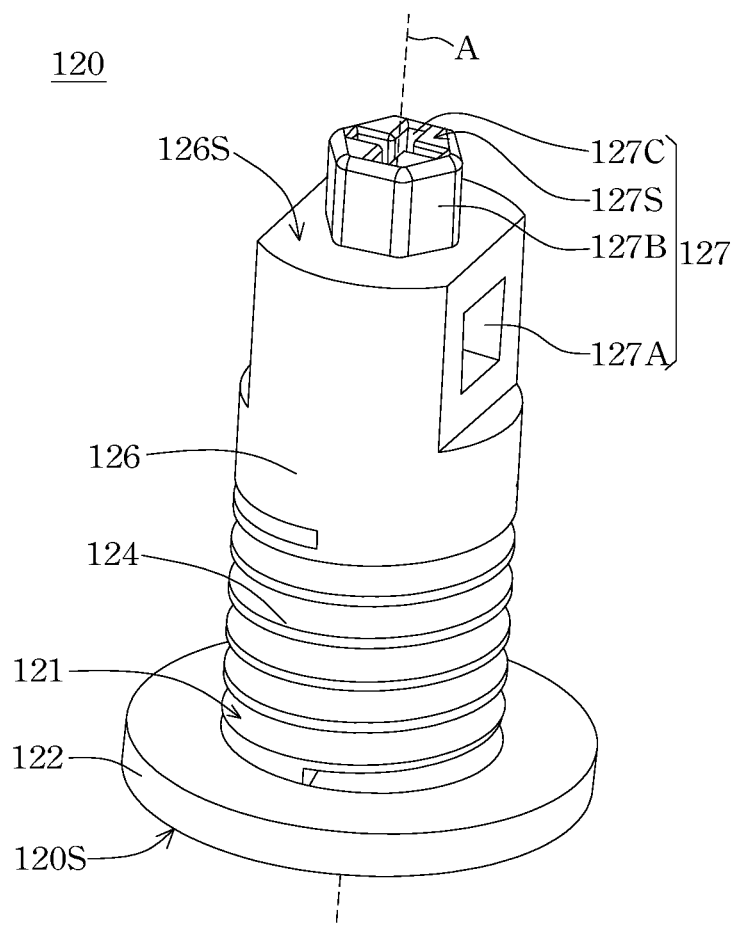
FIG. 5 is the perspective view of the pushing piece in the first example.

Please refer to FIG. 5, the column 124 of the pushing piece 120 in the first embodiment of the present invention further includes a force engagement side 126 opposite to the flange 122. The force engagement side 126 and the flange 122 are respectively located at opposite ends of the column 124, and a tool engagement part 127 is disposed on the force engagement side 126.

The tool engagement part 127 of the embodiment is suitable to be used by common assembly tools such as a rod, a screw driver, a wrench, etc. The tool engagement part 127 can include a radial through hole 127A, a protruding part 127B, a tool recess 127C or the combination thereof, the tool engagement part of the present invention is not limited to the configuration in FIG. 5, it can even exist simultaneously or separately in different ways in other example.

Figure 6:
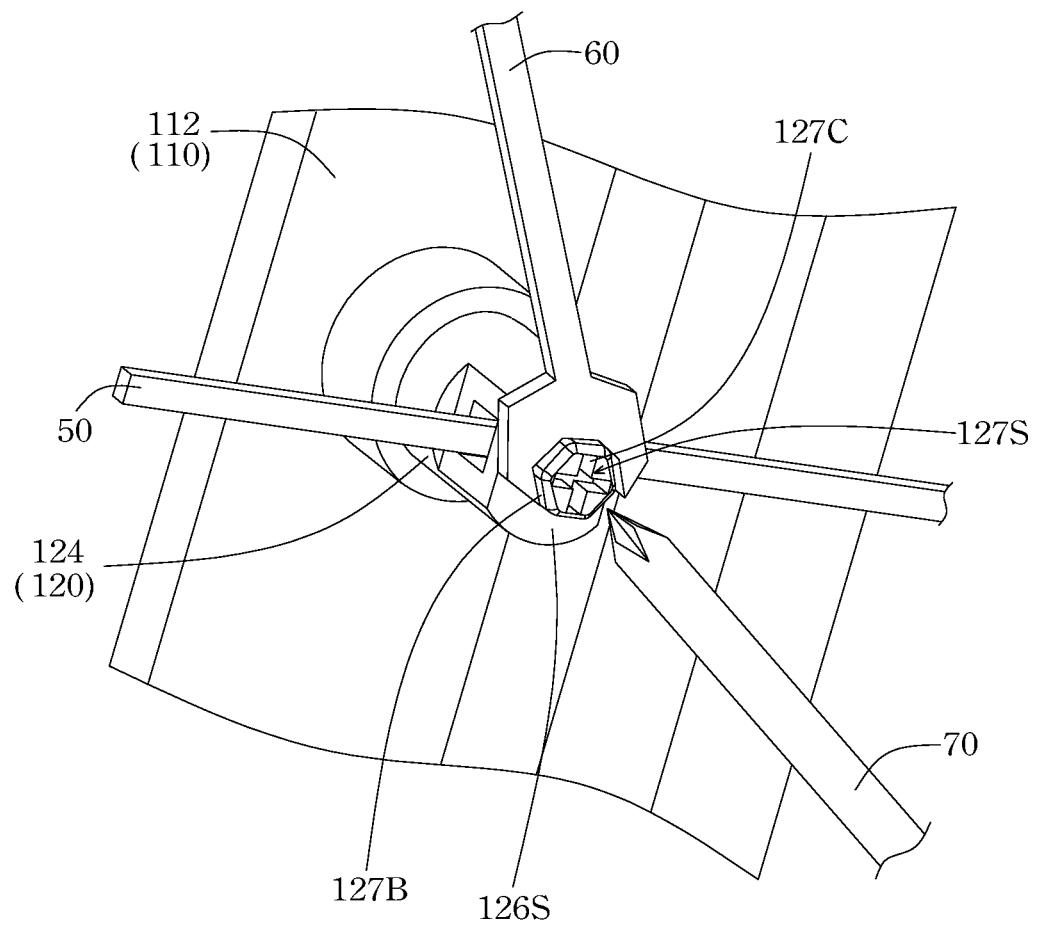
FIG. 6 is the schematic view of the frame, the pushing piece and assembly tools in the first example of the present invention.

FIG. 6 is the schematic view of the frame, the pushing piece and the assembly tools in the first embodiment of the present invention, and to show clearly the pushing piece, only the part adjacent to the supporting platform is drawn in FIG. 6. Please refer to FIG. 5 and FIG. 6 together, in an embodiment, the radial through hole 127A radially passes through the tool engagement part 127. Because the radial through hole 127A passes through the rotating axis A of the pushing piece 120, the rod 50 can pass through the radial through hole 127A to rotate the pushing piece 120. And since the rod 50 can increase the moment arm when rotating, the rod 50 can provide a labor-saving way to rotate the pushing piece 120 and push the substrate 130.

In an embodiment, the tool engagement part 127 includes protruding part 127B and the side surface 126S substantially extending along a radial direction of the column 124, the protruding part 127B can be a polygon pillar (such as a hexagonal pillar) and protrudes from the side surface 126S. The protruding part 127B does not cover the side surface 126S completely but revealing a part of the side surface 126S. The protruding part 127B is suitable for connecting with tools such as hexagonal wrench 60 and rotating the pushing piece 120, the hexagonal wrench can easily rotate the pushing piece 120 to push the substrate 130. Furthermore, as shown in FIG. 5, the cross section of the protruding part 127B is preferably smaller than the cross section of the column 124 in order to provide a space for using the hexagonal wrench 60, that is, the protruding part 127B does not cover the side surface 126S completely but reveal a part of the side surface 126S.

In an embodiment, the tool engagement part 127 may have a top surface 127S which is located on one side of the pushing piece 120 opposite to the pushing surface 120S. The top surface 127S is concave for forming the tool recess 127C, which is, for instance, single-slot-shaped or cross-slot-shaped, the screw driver 70 can be connected to the tool recess 127C to rotate the pushing piece 120 to push the substrate 130.

Figure 7:
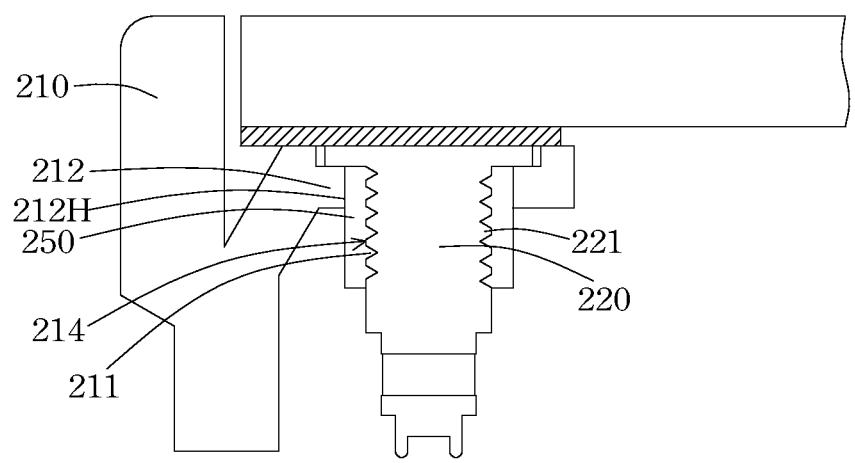
FIG. 7 is the partial sectional view of the second example of the display device.

On the other hand, the through hole 112H of the present invention is not limited to the aforementioned structure. Please refer to FIG. 7, which is the partial sectional view of the display device in the second embodiment of the present invention, wherein for the similar components and connection ways, please refer to the description of the first embodiment aforementioned, which is not repeated below. The difference between the display device of the second and the first embodiment is that the frame further includes a sleeve 250. The sleeve 250 is embedded in the supporting platform 212 and passes through the through hole 212H, and the inner surface 214 of the sleeve 250 has the inner thread 211. Thus, the aforementioned inner thread 211 can be formed by the inner surface 214, which has screw thread, of the sleeve 250, and then the sleeve 250 can be embedded in the supporting platform 212 to dispose the pushing piece 220. The pushing piece 220 has the outer thread 221 which meshes with the inner thread 211, and by the relative rotation of the outer thread 221 and the inner thread 211 to make the pushing piece relatively be moved to the sleeve 250. By this setting, the length of the inner surface 214, which has the inner thread 211, can be changed depending on the length of the sleeve 250; therefore, the length of the inner surface 214, which has the inner thread 211, is also not limited to the material and thickness of the supporting platform 212.

As seen above, in the embodiment of the present invention, the pushing piece can be disposed on the supporting platform, which is connected to the substrate, of the frame. And the pushing surface of the pushing piece can be selectively departed from the supporting surface of the supporting platform. Therefore, when the pushing surface stays with the supporting surface, the substrate can be fixed on the frame. When the pushing piece is moved to make the pushing surface away from the supporting surface, the pushing surface of the pushing piece can push the substrate to make the substrate to separate from the frame easily.

What is claimed is:

1. A display device including:
   a frame, including a supporting platform and a through hole, wherein the supporting platform has a supporting surface, and the through hole penetrates through the supporting platform from the supporting surface;
   a pushing piece, including a column and a flange, movably installed in the through hole, and having a pushing surface, wherein the flange connects to one side of the column and protrudes radially outside of the column, and the pushing surface is close to the supporting surface while the pushing piece is in the through hole; and
   a substrate, installed on the frame, covering the pushing surface and being connected to the supporting surface;
   wherein the pushing surface is formed on a side of the flange facing away from the column, and when the pushing piece moves relatively to the through hole and protrudes from the supporting surface, the pushing surface pushes the substrate and separates the substrate from the supporting surface.

2. The display device of claim 1, wherein the frame has an inner thread corresponding to the through hole, and the pushing piece has an outer thread which meshes the inner thread, and the pushing piece moves relatively to the through hole by the relative rotation of the inner thread and outer thread.

3. The display device of claim 2, wherein the through hole is surrounded by an inner wall of the frame, and the inner wall has the inner thread.

4. The display device of claim 2, the frame further includes a sleeve embedded in the supporting platform, wherein the sleeve passes through the through hole, and an inner surface of the sleeve has the inner thread.

5. The display device of claim 1, wherein the through hole includes a shank part and a threaded part, the shank part is located between the supporting surface and the threaded part, and an aperture of the through hole in the shank part is bigger than in the threaded part;
   when the pushing piece is disposed in the through hole, the flange is within the shank part of the through hole.

6. The display device of claim 5, wherein a thickness of the flange is substantially the same as a length of the shank part in a direction of normal of the supporting surface.

7. The display device of claim 1, wherein the pushing piece further includes a tool engagement part, and the column has a force engagement side which is in opposition to the flange, wherein the tool engagement part is located on the force engagement side.

8. The display device of claim 7, wherein the tool engagement part includes a radial through hole which radially passes through the tool engagement part.

9. The display device of claim 7, wherein the tool engagement part includes a side surface which substantially extends along a radial direction of the column and a protruding part which is a polygon pillar protruding from the side surface, and the side surface does not completely covered by the protruding part so a part of the side surface is revealed.

10. The display device of claim 7, wherein the tool engagement part has a top surface which is disposed in the opposition to the pushing surface on the pushing piece, and the top surface is concave for forming a tool recess.

11. A display device including:
    a frame, including a supporting platform and a through hole, wherein the supporting platform has a supporting surface, and the through hole penetrates through the supporting platform from the supporting surface;
    a pushing piece, movably installed in the through hole, and having a pushing surface, wherein the pushing surface is close to the supporting surface while the pushing piece is in the through hole;
    a substrate, installed on the frame, covering the pushing surface and being connected to the supporting surface; and
    an adhesive layer locating between the supporting surface and the substrate, and the substrate is connected to the supporting surface by the adhesive layer;
    wherein when the pushing piece moves relatively to the through hole and protrudes from the supporting surface, the pushing surface pushes the substrate and separates the substrate from the supporting surface.

12. The display device of claim 11, wherein the adhesive layer is further disposed between the pushing surface and the substrate, and the substrate is connected to the pushing surface by the adhesive layer.

13. The display device of claim 12, wherein an adhesion between the adhesive layer and the supporting surface is stronger than an adhesion between the adhesive layer and the pushing surface.

14. The display device of claim 1, wherein the substrate includes a cover lens, a touch panel or a display panel.

15. The display device of claim 11, wherein the substrate includes a cover lens, a touch panel or a display panel.

* * * * *